(12) United States Patent
Kamiya et al.

(10) Patent No.: US 7,847,574 B2
(45) Date of Patent: Dec. 7, 2010

(54) SEMICONDUCTOR DEVICE

(75) Inventors: Hisao Kamiya, Osaka (JP); Kazuhiro Yoshida, Osaka (JP); Takashi Ohtori, Osaka (JP)

(73) Assignee: Panasonic Corporation, Osaka (JP)

( * ) Notice: Subject to any disclaimer, the term of this patent is extended or adjusted under 35 U.S.C. 154(b) by 264 days.

(21) Appl. No.: 12/067,138

(22) PCT Filed: Jul. 17, 2007

(86) PCT No.: PCT/JP2007/064109

§ 371 (c)(1),
(2), (4) Date: Mar. 17, 2008

(87) PCT Pub. No.: WO2008/059638

PCT Pub. Date: May 22, 2008

(65) Prior Publication Data

US 2009/0302879 A1 Dec. 10, 2009

(30) Foreign Application Priority Data

Nov. 13, 2006 (JP) ............................ 2006-306431

(51) Int. Cl.
*G01R 31/26* (2006.01)
(52) U.S. Cl. .................................... 324/765
(58) Field of Classification Search ........................ None
See application file for complete search history.

(56) References Cited

U.S. PATENT DOCUMENTS

| 4,125,875 | A * | 11/1978 | Saito .............................. 365/1 |
| 7,337,379 | B2 * | 2/2008 | Hiraide ......................... 714/724 |
| 7,600,167 | B2 * | 10/2009 | Shoda .......................... 324/765 |
| 2003/0057991 | A1 | 3/2003 | Sanada |
| 2003/0229838 | A1 * | 12/2003 | Hiraide ......................... 714/738 |
| 2004/0250186 | A1 * | 12/2004 | Takasaki ....................... 714/726 |
| 2007/0168803 | A1 * | 7/2007 | Wang et al. ................... 714/726 |
| 2007/0250284 | A1 * | 10/2007 | Takeoka et al. .............. 702/117 |
| 2008/0092002 | A1 * | 4/2008 | Shimooka .................... 714/731 |

FOREIGN PATENT DOCUMENTS

| JP | 05-341013 | 12/1993 |
| JP | 07-218595 | 8/1995 |
| JP | 2000-311987 | 11/2000 |

(Continued)

OTHER PUBLICATIONS

English Translation of JP 2004-340877, Dec. 2, 2004.*

*Primary Examiner*—Jermele M Hollington
(74) *Attorney, Agent, or Firm*—McDermott Will & Emery LLP

(57) ABSTRACT

When a stop condition is satisfied, a stop condition determination circuit (10) issues a stop instruction to an operation stop control circuit (11) to stop the operation of a functional circuit (14). A storage device (12) stores therein determination results made by the stop condition determination circuit (10) and operation conditions in the functional circuit (14). An external conveying means (13) conveys the determination results made by the stop condition determination circuit (10) to outside the semiconductor device. If these determination results are used by a peripheral device external to the semiconductor device, it is possible to prevent failures in the peripheral device and malfunctions in the system caused by faults in the semiconductor device.

10 Claims, 9 Drawing Sheets

FOREIGN PATENT DOCUMENTS

| | | |
|---|---|---|
| JP | 2000-321331 | 11/2000 |
| JP | 2004-340877 | 12/2004 |
| JP | 2005-069931 | 3/2005 |
| JP | 2006-269477 | 10/2006 |
| JP | 2006-303480 | 11/2006 |

* cited by examiner

SEMICONDUCTOR DEVICE

RELATED APPLICATIONS

This application is the U.S. National Phase under 35 U.S.C. §371 of International Application No. PCT/JP2007/064109, filed on Jul. 17, 2007, which in turn claims the benefit of Japanese Application No. 2006-306431, filed on Nov. 13, 2006, the disclosures of which Applications are incorporated by reference herein.

TECHNICAL FIELD

The present invention relates to a semiconductor device, and particularly relates to a semiconductor integrated circuit (hereinafter referred to as an "LSI") including a fault diagnosis means or an operation stop control means.

BACKGROUND ART

A curve shown in FIG. 9 indicates the rate of failures occurring with time in an LSI. This curve, similar in shape to a bathtub, is called a bathtub curve. Failures in an LSI are divided into early failures, random failures, and wear-out failures.

Conventional LSIs are inspected prior to shipment so as to ensure the quality thereof. Such pre-shipment inspection is performed after the LSIs are put under load which is heavier than specified by the specifications in terms of temperature and voltage conditions, such that products in which early failures will occur over time are prevented from appearing on the market.

With such pre-shipment inspection, however, it has been difficult to deal with failures that could occur in an LSI shipped as a finished product to be incorporated into a system and continuously used in the system, in particular, failures corresponding to wear-out failures in a bathtub curve.

In addition, as the degree of integration in LSIs has been increased, each LSI has become multifunctional. This may result in a situation in which one functional circuit in an LSI has no degradation failure, but another functional circuit suffers a degradation failure.

In order to address these problems, a conventional semiconductor device incorporates two or more functional circuits, performs self-diagnosis, and uses one of the functional circuits that has no fault, thereby extending the life of the LSI (see Patent Document 1, for example).

There is another semiconductor device, in which self-diagnosis is performed on a functional circuit, and supply of a clock is stopped to halt the operation of the functional circuit (see Patent Document 2, for example).

Patent Document 1: Japanese Laid-Open Publication No. 2004-340877
Patent Document 2: Japanese Laid-Open Publication No. 05-341013

DISCLOSURE OF THE INVENTION

Problems that the Invention Intends to Solve

In the above-described techniques, since two or more functional circuits are incorporated and self-diagnosis circuits are provided, the circuit size is increased. Furthermore, only after a fault occurs, the operation is stopped according to the self-diagnosis results, and it is thus not possible to predict a fault and stop the operation before the fault occurs.

In view of the above problems, it is therefore an object of the invention to enable a semiconductor device to perform fault diagnosis with a small circuit and stop the operation of the semiconductor device in accordance with fault prediction before a fault occurs, thereby increasing the security of the semiconductor device.

Means for Solving the Problems

In order to solve the problems, a first aspect of the invention is directed to a semiconductor device including: a shift register including two or more flip flops; and fault diagnosis means for determining the presence or absence of a fault according to an output from the shift register.

A second aspect of the invention is directed to the semiconductor device according to the first aspect, wherein the shift register includes: a first flip flop; delay means for receiving an output from the first flip flop; a second flip flop for receiving an output from the delay means; and means capable of adjusting a delay time of the delay means.

A third aspect of the invention is directed to a semiconductor device including: power supply voltage measuring means for measuring a power supply voltage; storage means for storing the value of the measured power supply voltage; and fault diagnosis means for determining the presence or absence of a fault according to a comparison between the voltage value measured by the power supply voltage measuring means and the voltage value stored in the storage means.

A fourth aspect of the invention is directed to a semiconductor device including: stop condition determination means for making at least one operation-stop determination; and operation stop control means for stopping operation of the entire semiconductor device or of part of the semiconductor device according to the determination made by the stop condition determination means.

A fifth aspect of the invention is directed to the semiconductor device according to the fourth aspect, wherein the stop condition determination means includes: a shift register including two or more flip flops; and fault diagnosis means for determining the presence or absence of a fault according to an output from the shift register.

A sixth aspect of the invention is directed to the semiconductor device according to the fifth aspect, wherein the shift register includes: a first flip flop; delay means for receiving an output from the first flip flop; a second flip flop for receiving an output from the delay means; and means capable of adjusting a delay time of the delay means.

A seventh aspect of the invention is directed to the semiconductor device according to the fourth aspect, wherein the stop condition determination means includes: power supply voltage measuring means for measuring a power supply voltage; storage means for storing the value of the measured power supply voltage; and fault diagnosis means for determining the presence or absence of a fault according to a comparison between the voltage value measured by the power supply voltage measuring means and the voltage value stored in the storage means.

An eighth aspect of the invention is directed to the semiconductor device according to the fourth aspect, wherein the stop condition determination means includes: timer means capable of measuring a specified period of time; and means for generating a stop condition when the amount of time measured by the timer means has reached the specified period of time.

A ninth aspect of the invention is directed to the semiconductor device according to the fourth aspect, wherein the stop condition determination means generates a stop condition according to a stop request from outside the semiconductor device.

A tenth aspect of the invention is directed to the semiconductor device according to the fourth aspect, wherein the operation stop control means includes a fuse and stops operation of the entire semiconductor device or of part of the semiconductor device by disconnecting the fuse.

An eleventh aspect of the invention is directed to the semiconductor device according to the tenth aspect, wherein the operation stop control means further includes an anti-fuse in parallel with the fuse and is capable of terminating the operation stop state of the entire semiconductor device or of part of the semiconductor device even after the disconnection of the fuse by reconnecting the disconnected fuse by the anti-fuse.

A twelfth aspect of the invention is directed to the semiconductor device according to the fourth aspect, further including storage means for storing a result of the determination made by the stop condition determination means.

A thirteenth aspect of the invention is directed to the semiconductor device according to the fourth aspect, further including means for conveying a result of the determination made by the stop condition determination means to outside the semiconductor device.

A fourteenth aspect of the invention is directed to a system including: the semiconductor device according to the fourth aspect of the invention and a peripheral device, wherein the stop condition determination means conducts fault diagnosis on a connection path between the semiconductor device and the peripheral device.

A fifteenth aspect of the invention is directed to a system including: the semiconductor device of the fourth aspect of the invention and a peripheral device, wherein the stop condition determination means conducts fault diagnosis on the peripheral device.

EFFECTS OF THE INVENTION

The invention enables a semiconductor device to perform fault detection with a small circuit and stop the operation of the semiconductor device in accordance with fault prediction before a fault occurs, thereby increasing the security of the semiconductor device.

EXPLANATION OF THE REFERENCE CHARACTERS

Figure 1:
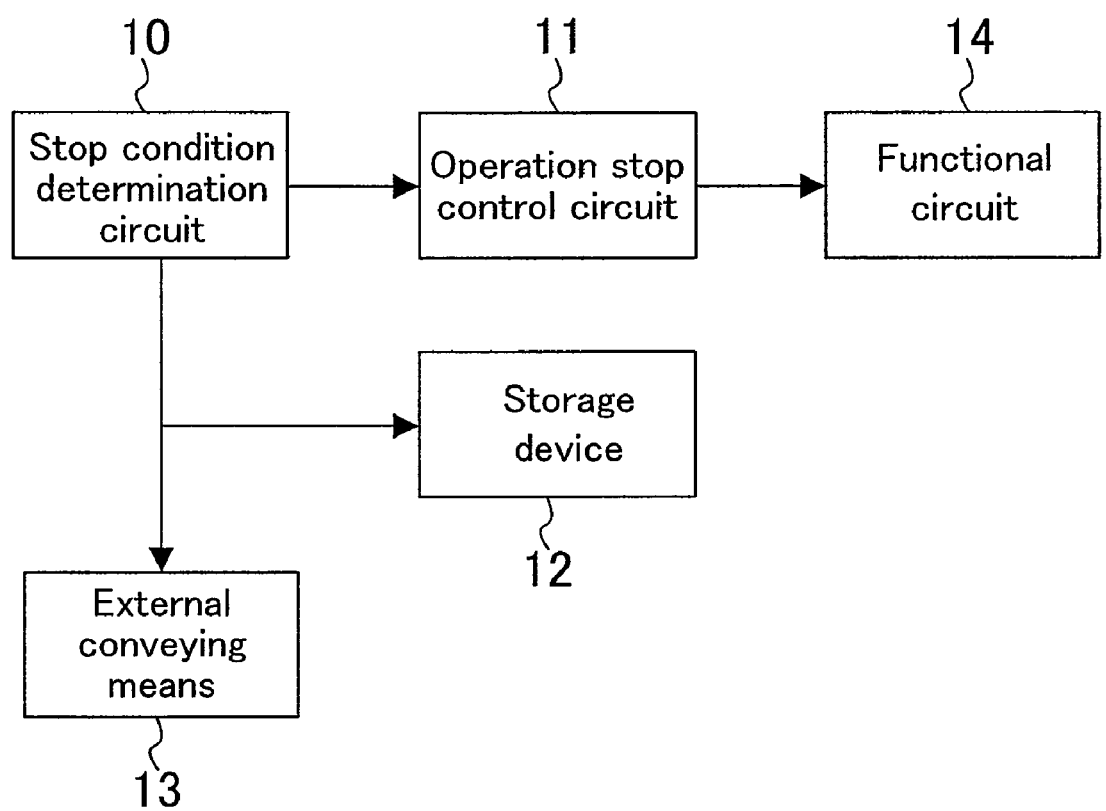
FIG. 1 illustrates the structure of a semiconductor circuit according to a first embodiment of the invention.

10 Stop condition determination means
11 Operation stop control circuit
12 Storage device
13 External conveying means
14 Functional circuit
20 Semiconductor device
21 Peripheral device
22 Functional circuit
100, 101 Shift registers
102 Flip flops
103 Delay circuits
104 AND element
105 Fault diagnostic circuit
110 Resistance elements
111 Operational amplifier
112 A/D converter
113 Storage circuit
114 Comparator
120 Clock source
121 Reset source
122 AND elements
130 Clock source
131 Fuse element
132 Anti-fuse element
133 AND element
134 Non-faulty normal-time clock supply/stop control circuit
135 Resistance element
140 Switching devices
160 Delay elements
161 Selection circuit

BEST MODE FOR CARRYING OUT THE INVENTION

Hereinafter, the preferred embodiments of the invention will be described with reference to the accompanying drawings. In the drawings, the same or equivalent components are denoted by the same reference numerals, and description thereof will not be repeated.

First Embodiment

FIG. 1 illustrates an example of the structure of a semiconductor device according to a first embodiment of the invention. This semiconductor device includes a stop condition determination circuit 10, an operation stop control circuit 11, a storage device 12, an external conveying means 13, and a functional circuit 14.

In the semiconductor device shown in FIG. 1, when a stop condition is satisfied, the stop condition determination circuit 10 issues a stop instruction to the operation stop control circuit 11 to stop the operation of the functional circuit 14. The storage device 12 stores determination results made by the stop condition determination circuit 10 and operation conditions in the functional circuit 14. If determination results made by the stop condition determination circuit 10 are stored in the storage device 12 at regular time intervals, it becomes possible to examine a history of the past determination results and past operation conditions. Furthermore, if the storage device 12 is configured in such a manner that data therein is readable from outside, operation conditions and fault conditions in the functional circuit 14 can be easily known. As the operation conditions in the functional circuit 14, for example, status register values indicating operation conditions are stored. The external conveying means 13 conveys the determination results made by the stop condition determination circuit 10 to outside the semiconductor device. If these determination results are used by a peripheral device external to the semiconductor device, it is possible to prevent failures in the peripheral device and malfunctions in the system caused by faults in the semiconductor device. The external conveying means may convey the determination results to outside the semiconductor device by producing a sound, by making an LED light up, blink, or change the color of light, or by indicating a message on a display device, for example.

<First Example of the Configuration of the Stop Condition Determination Circuit 10>

Figure 2:
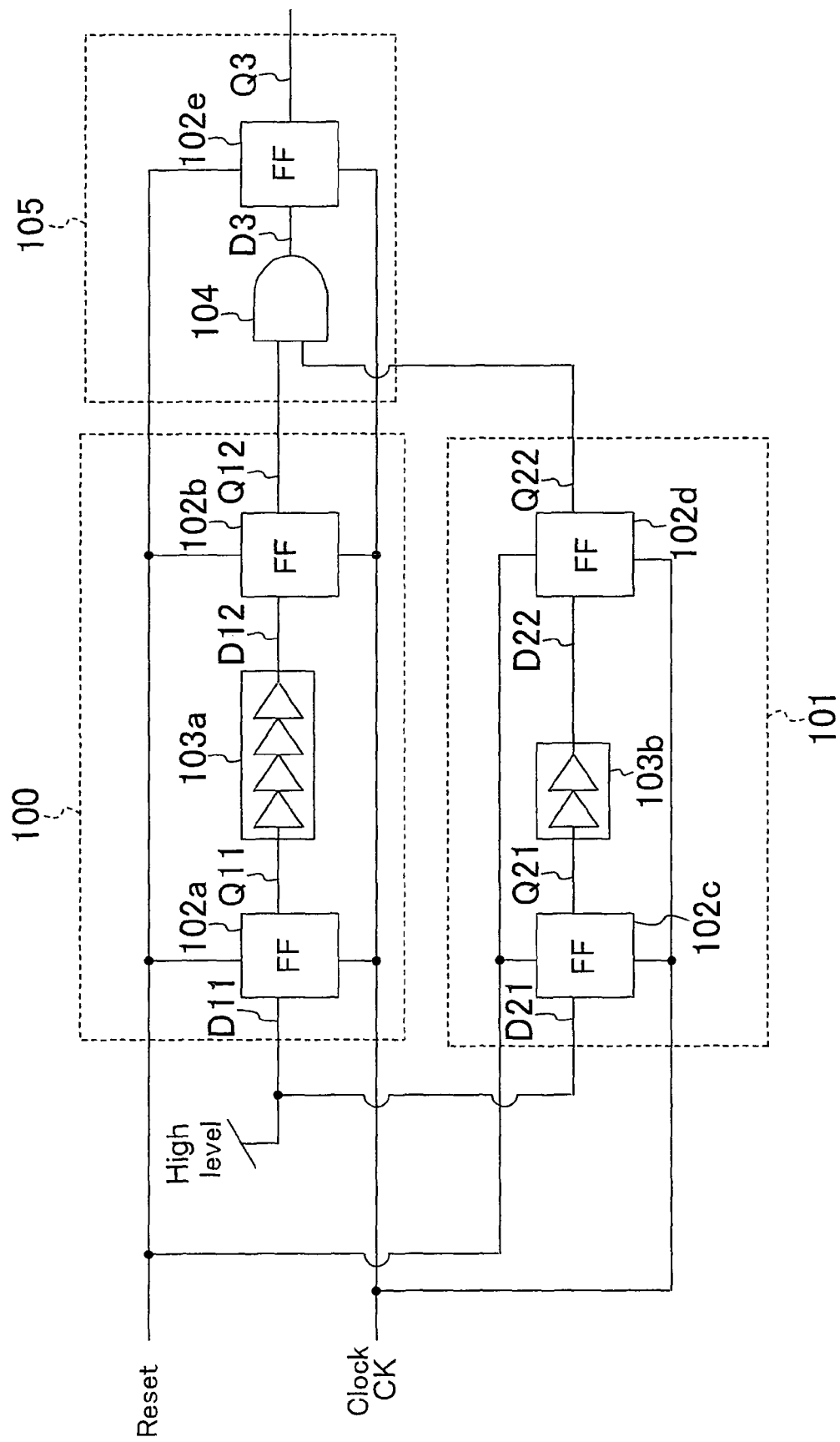
FIG. 2 illustrates an example of the configuration of a stop condition determination circuit 10 shown in FIG. 1.
Figure 3:
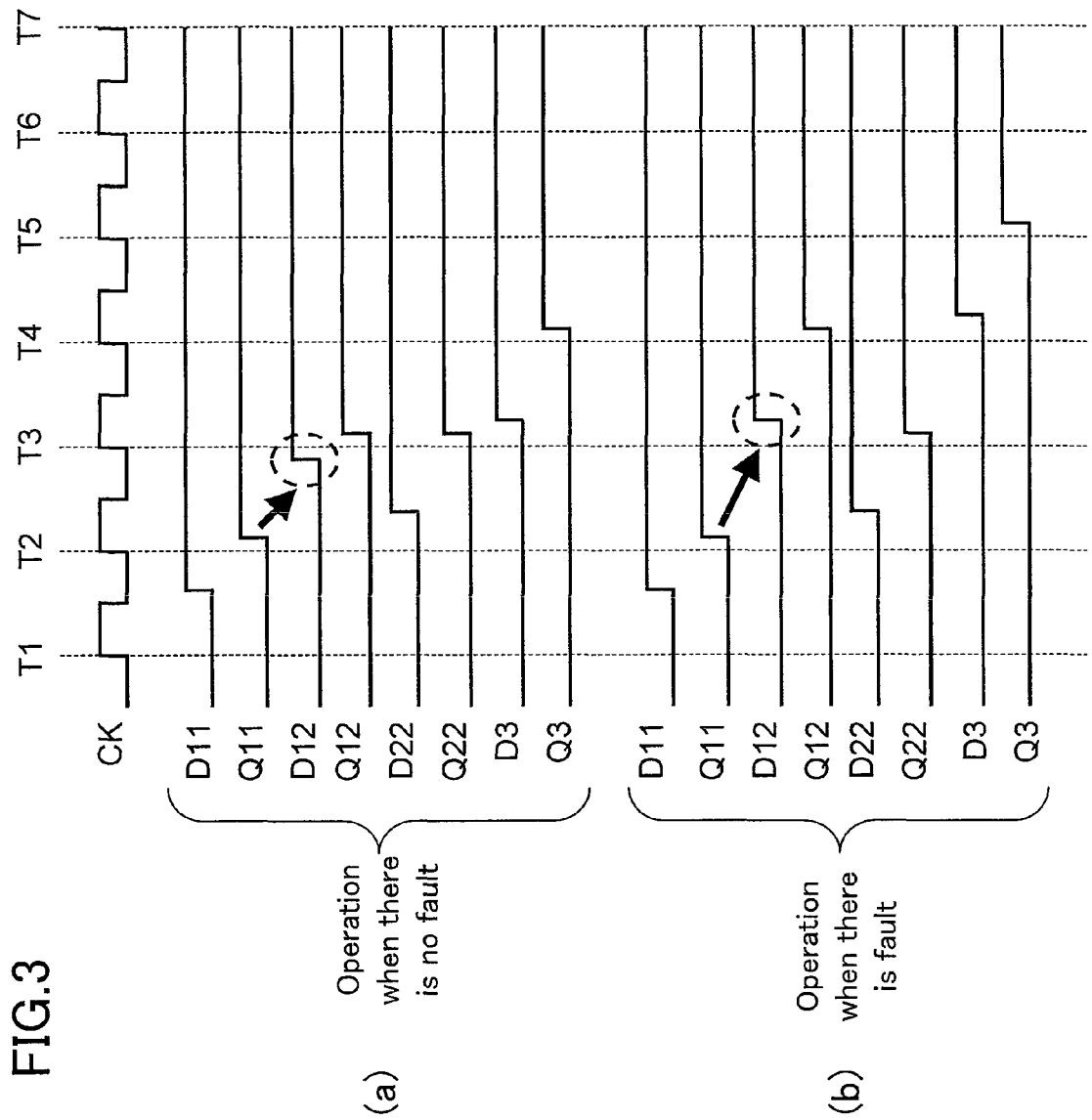
FIG. 3 is a timing chart indicating operation of the operation condition determination circuit shown in FIG. 2.

FIG. 2 shows an example of the configuration of the stop condition determination circuit 10, in which a fault diagnosis means is realized by shift registers. FIG. 3 shows a timing chart for the stop condition determination circuit 10 shown in FIG. 2.

The stop condition determination circuit 10 shown in FIG. 2 includes shift registers 100 and 101 and a diagnostic circuit 105. The shift registers 100 and 101 include flip flops 102 and delay circuits 103 interposed therebetween. The diagnostic circuit 105 conducts fault diagnosis based on the timing of output signals from the shift registers 100 and 101. The amount of delay of the delay circuit 103a in the shift register 100 differs from that of the delay circuit 103b in the shift register 101. The delay circuit 103a is designed so as to produce the amount of delay that provides such timing as permits a signal to be barely propagated between the flip flops 102a and 102b. The delay circuit 103b is designed so as to produce the amount of delay that provides such timing as allows an enough margin for propagation of a signal between the flip flops 102c and 102d.

Operation of the stop condition determination circuit 10 shown in FIG. 2 will be described with reference to the timing chart shown in FIG. 3. "H" level signals applied as signals D11 and D21 are passed through the flip flops 102a and 102c, delayed by the delay circuits 103a and 103b, and input to the flip flops 102b and 102d, respectively, and then passed through an AND element 104 and a flip flop 102e, which form the diagnostic circuit 105, so as to be output from Q3. Since the amount of delay of the delay circuit 103a is greater than that of the delay circuit 103b, the time at which the signal D12 changes comes after the time at which the signal D22 changes.

Where there is no delay fault, the signals D12 and D22 both change between T2 and T3 as shown in the upper part (a) of the timing chart in FIG. 3. Thus, output signals Q12 and Q22 from the flip flops 102b and 102d both change between T3 and T4, such that an output signal Q3 from the flip flop 102e changes between T4 and T5.

On the other hand, where there is a delay fault in the wire between the flip flops 102a and 102b, the time at which the signal D12 changes is delayed as shown in the lower part (b) of the timing chart in FIG. 3. Thus, the time at which the output signal Q12 from the flip flop 102b changes is also delayed, such that the output signal Q12 changes between T4 and T5. As a result, the output signal Q3 from the flip flop 102e changes between T5 and T6, delayed as compared with the case where no delay fault occurs.

From this, it can be determined whether or not there is a delay fault.

If the shift register 100 is placed in part of the semiconductor device, for example, where voltage drop (IR-Drop) in the power supply wiring is large in terms of layout, i.e., where the signal delay time of a wire in a functional circuit is long, the shift register 100 functions more effectively.

<Example of the Configuration of the Delay Circuit 103a>

Figure 4:
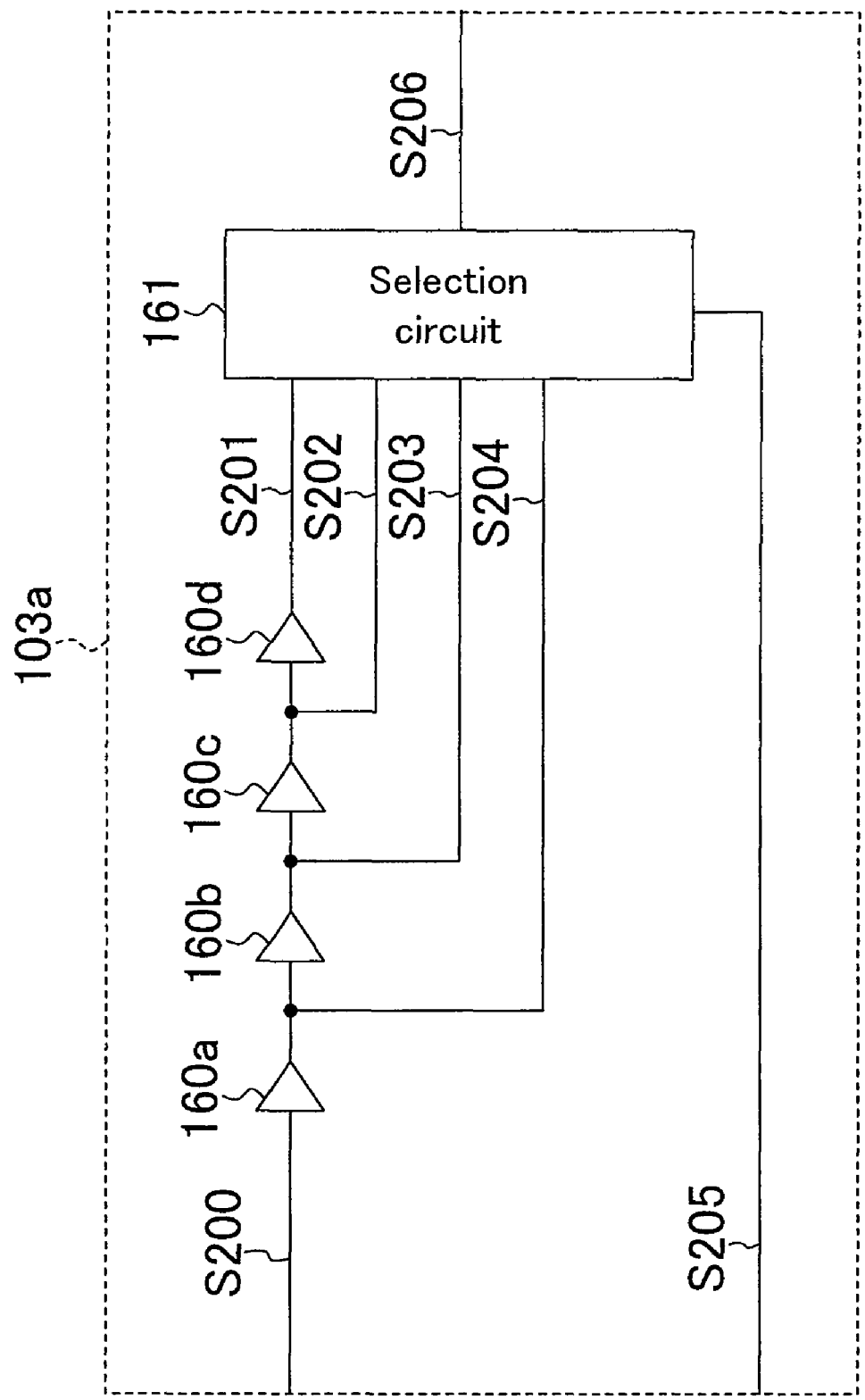
FIG. 4 illustrates an example of the configuration of a delay circuit shown in FIG. 2.

FIG. 4 shows an example of the configuration of the delay circuit 103a illustrated in FIG. 2. The amount of delay of the delay circuit 103a is varied due to manufacturing factors and operation condition factors. However, the use of a delay circuit capable of adjusting the delay time as shown in FIG. 4 enables the amount of delay to be adjusted with those variations taken into account so as to provide such timing as allows a signal to be barely propagated between the flip flops 102a and 102b shown in FIG. 3.

In FIG. 4, the reference numerals 160a, 160b, 160c and 160d denote delay elements. The amounts of delay of the delay elements 160a, 160b, 160c and 160d may be the same or may be different from each other. An input signal S200 (Q11) to the delay circuit 130a is delayed by each of the delay elements 160a, 160b, 160c and 160d, thereby producing signals S201, S202, S203 and S204. A selection circuit 161 selects one of the signals S201, S202, S203 and S204 in accordance with a selection signal S205 and outputs the selected signal as an output signal S206 (D12).

A description will be made of operation performed when the delay circuit illustrated in FIG. 4 is used as the delay circuit 103a shown in FIG. 2. If the selection signal S205 shown in FIG. 4 is varied, the output signal Q3 from the flip flop 102e changes between T4 and T5 or between T5 and T6 shown in FIG. 3. The state of the selection signal S205 that results in the maximum delay time that allows the output signal Q3 from the flip flop 102e to change between T4 and T5 shown in FIG. 3 is specified when the shipment inspection of the LSI is conducted. The specified state is stored in a storage device in the LSI. Then, after the shipment of the LSI, it is possible to adjust the selection signal S205 to the state specified at the time of the shipment inspection by reading the stored state. An example of the storage device may be a non-volatile memory which stores a value even after power shutdown.

<Second Example of the Configuration of the Stop Condition Determination Circuit 10>

Figure 5:
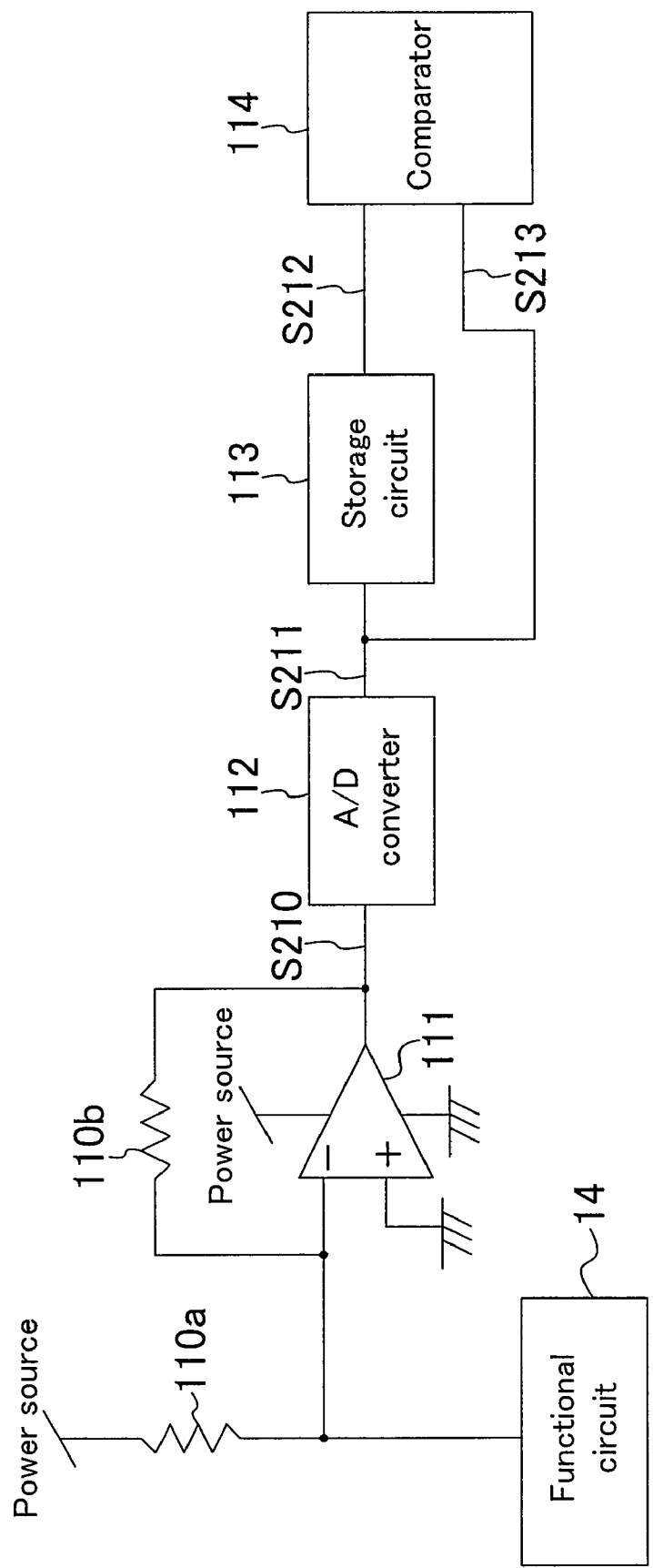
FIG. 5 illustrates another example of the configuration of the stop condition determination circuit 10 shown in FIG. 1.

FIG. 5 shows another example of the configuration of the stop condition determination circuit 10, in which a fault diagnosis means is realized by a power supply voltage measuring means for measuring power supply voltage.

The stop condition determination circuit 10 shown in FIG. 5 includes resistors 110a and 110b, an operational amplifier 111, an A/D converter 112, a storage circuit 113, and a comparator 114. A power supply voltage applied to the functional circuit 14 is input to an inverting amplifier circuit, which is composed of the resistors 110a and 110b and the operational amplifier 111, and the output signal thereof is input to the storage circuit 113 and to the comparator 114 through the A/D converter 112. The storage circuit 113 regularly stores an output result from the A/D converter 112 and inputs the value of the result to the comparator 114. In a case where a fault occurs in the functional circuit 14 to cause the power supply voltage applied to the functional circuit 14 to have an abnormal value, the abnormal condition is detectable by a comparison by the comparator 114 between the output result from the A/D converter 112 and a past power supply voltage value stored in the storage circuit 113, whereby the functional circuit 14 is determined to be faulty. In the method of making the fault determination by the storage circuit 113 and the comparator 114, the determination may be made, for example, by using the value of the power supply voltage at power-up or by comparing time-series variations in the power supply voltage value during the operation after the power-up. Moreover, in order to prevent a tiny variation in the power supply voltage value from being erroneously determined to be a fault, the fault determination may be made based on multiple determination results.

In this example, the fault diagnosis means is realized by the power supply voltage measuring means. Nevertheless, a power supply current measuring means may be used in place of the power supply voltage measuring means. Furthermore, SCAN test results, self-diagnosis test results, or external diagnostic test results may be input as the signals input to the storage circuit 113 and to the comparator 114, and the fault determination may be made according to those results.

<Third Example of the Configuration of the Stop Condition Determination Circuit 10>

A circuit which uses a timer capable of measuring a specified period of time will be described as another example of the configuration of the stop condition determination circuit 10. A timer circuit capable of measuring a specified period of time is incorporated into the semiconductor device. The time in which the functional circuit 14 it to be stopped is set in the timer circuit, and the functional circuit 14 is stopped upon expiration of that time. This prevents occurrence of malfunction caused by a fault in the semiconductor device resulting from a prolonged use of the system. Furthermore, if the remaining time in the timer circuit is made readable from outside, it is possible to know when the semiconductor device reaches the end of the life thereof. Hence, for example, by replacing the semiconductor device before the semiconductor device becomes faulty due to deterioration thereof, malfunction in the system is prevented and the life of the system is extended.

In the example described above, the stop condition determination circuit 10 in the semiconductor device issues a stop instruction to the operation stop control circuit 11 to thereby stop the operation of the functional circuit 14. However, another means may be adopted which stops the functional circuit 14 by inputting a stop instruction provided from outside the semiconductor device to the operation stop control circuit 11. A description will be made of a case in which a means for stopping the operation by a stop instruction provided from outside the semiconductor device, and the external conveying means 13 shown in FIG. 1 are used. If results are stored in a device which centrally controls operation conditions through a network, so that the life of the device is statistically controlled and an operation stop instruction is issued from the central control device according to data stored in a storage circuit in the semiconductor device, it becomes possible to stop the operation even before the semiconductor device becomes faulty, which increases the degree of security.

<First Example of the Configuration of the Operation Stop Circuit 11>

Figure 6:
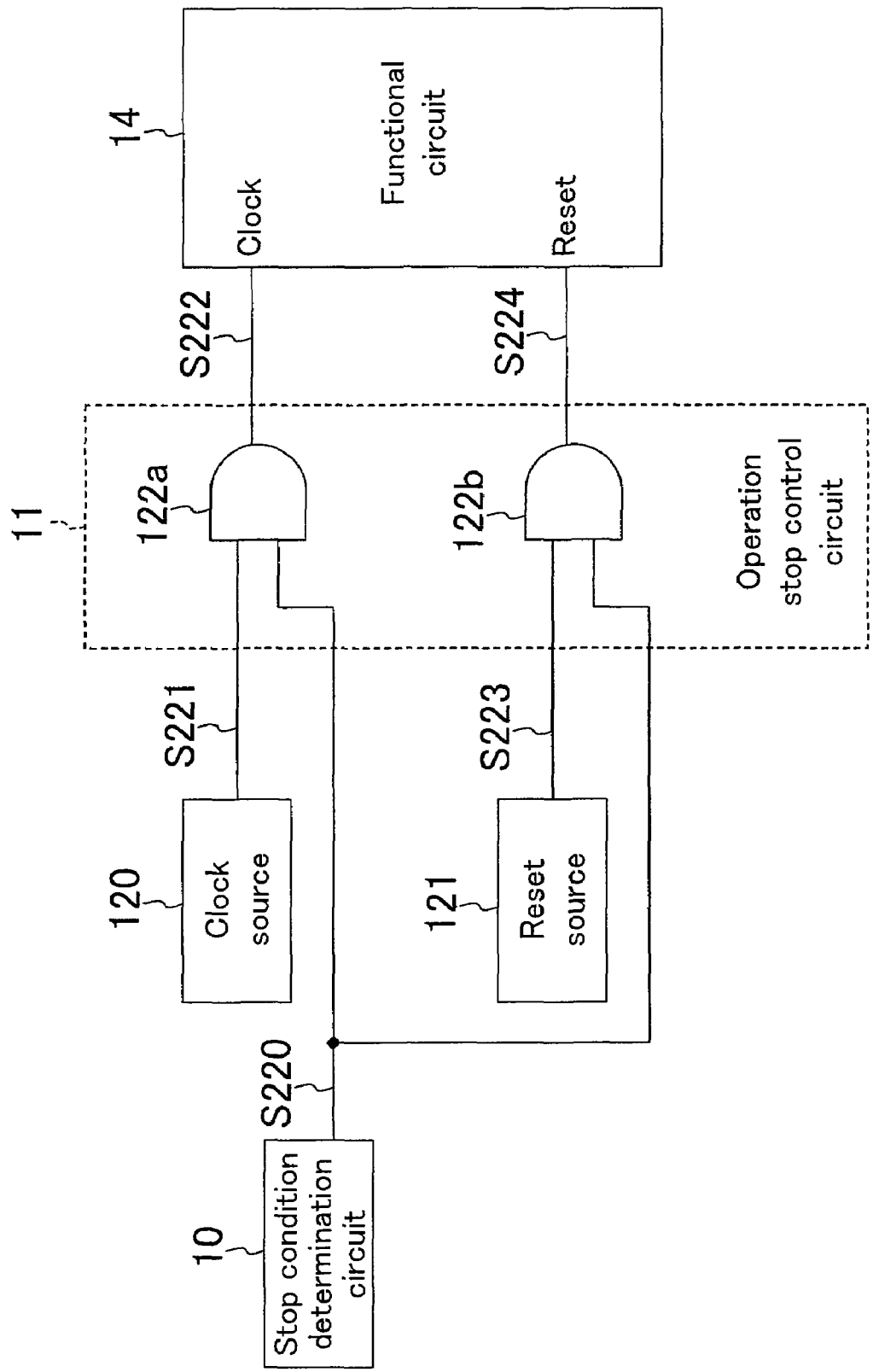
FIG. 6 illustrates an example of the configuration of an operation stop circuit 11 shown in FIG. 1.

FIG. 6 shows, as an example of the configuration of the operation stop circuit 11 shown in FIG. 1, a circuit in which AND elements are used as circuits for controlling a clock signal and a reset signal input to the functional circuit 14.

As shown in FIG. 6, a clock signal S222 input to the functional circuit 14 is an AND signal which is produced in the operation stop control circuit 11 from a clock signal S221 output from a clock source 120 and a stop condition determination signal S220 output from the stop condition determination circuit 10.

A reset signal S224 input to the functional circuit 14 is an AND signal which is produced in the operation stop control circuit 11 from a reset signal S223 output from a reset source 121 and the stop condition determination signal S220 output from the stop condition determination circuit 10.

Upon detection of a fault in the functional circuit 14, the stop condition determination circuit 10 outputs an "L" level signal as the stop condition determination signal S220, whereby the supply of the clock signal to the functional circuit 14 is stopped and the reset signal is fixed, causing the functional circuit 14 to stop.

In this example, although the clock signal S222 and the reset signal S224 are controlled at the same time by the single stop condition determination signal S220, a circuit in which the clock signal S222 and the reset signal S224 are separately controlled may also be adopted.

<Second Example of the Configuration of the Operation Stop Circuit 11>

Figure 7:
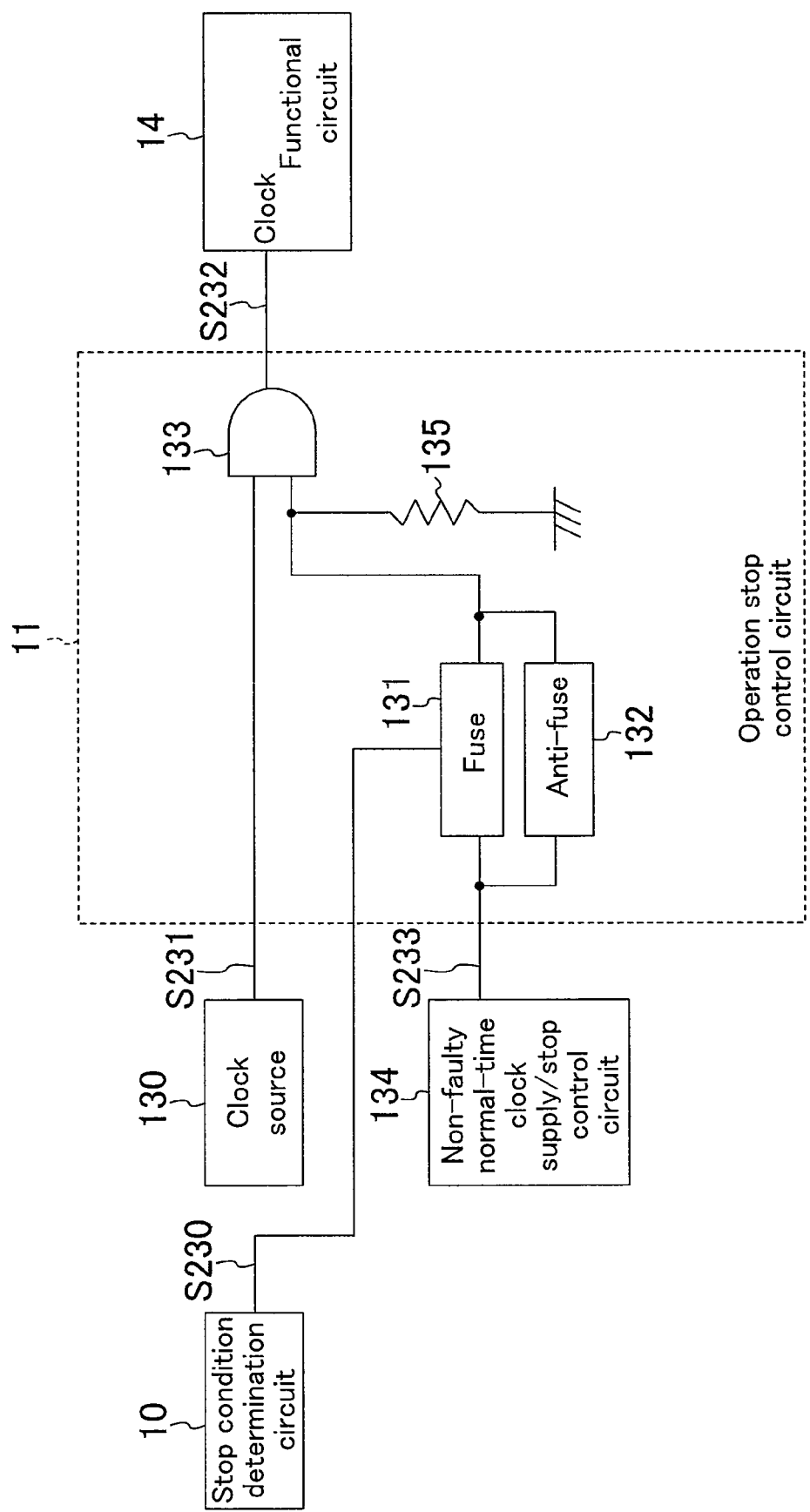
FIG. 7 illustrates another example of the configuration of the operation stop circuit 11 shown in FIG. 1.

FIG. 7 shows, as another example of the configuration of the operation stop circuit 11 shown in FIG. 1, a circuit in which a fuse element and an anti-fuse element are used as a circuit for controlling a clock signal input to the functional circuit 14.

As shown in FIG. 7, a clock signal S232 input to the functional circuit 14 is an AND signal which is produced in the operation stop control circuit 11 from a clock signal S231 output from a clock source 130 and a signal S233 output from a non-faulty normal-time clock supply/stop control circuit 134. The signal S233 passes through a fuse element 131, which is disconnectable by a stop condition determination signal S230 output from the stop condition determination circuit 10, and is input to an AND element 133.

Upon detection of a fault in the functional circuit 14, the stop condition determination circuit 10 disconnects the fuse element 131 by the stop condition determination signal S230, whereby the supply of the clock signal to the functional circuit 14 is stopped, causing the functional circuit 14 to stop.

Also, the signal S233 is reconnectable by the anti-fuse 132, such that it is easy to terminate the operation stop state and perform failure analysis of the faulty functional circuit 14.

In this example, the circuit for controlling the clock signal is described, but another circuit may be employed in which the operation of the functional circuit 14 is controlled by making a reset source have a similar circuit configuration.

In the first and second examples of the configuration of the operation stop circuit 11, the circuits for controlling the clock signal and the reset signal are described. Nevertheless, other circuits may be adopted in which the operation of the functional circuit 14 is stopped by fixing input data to the functional circuit 14 or by fixing the output signal of the functional circuit 14 to a disable condition.

Second Embodiment

Figure 8:
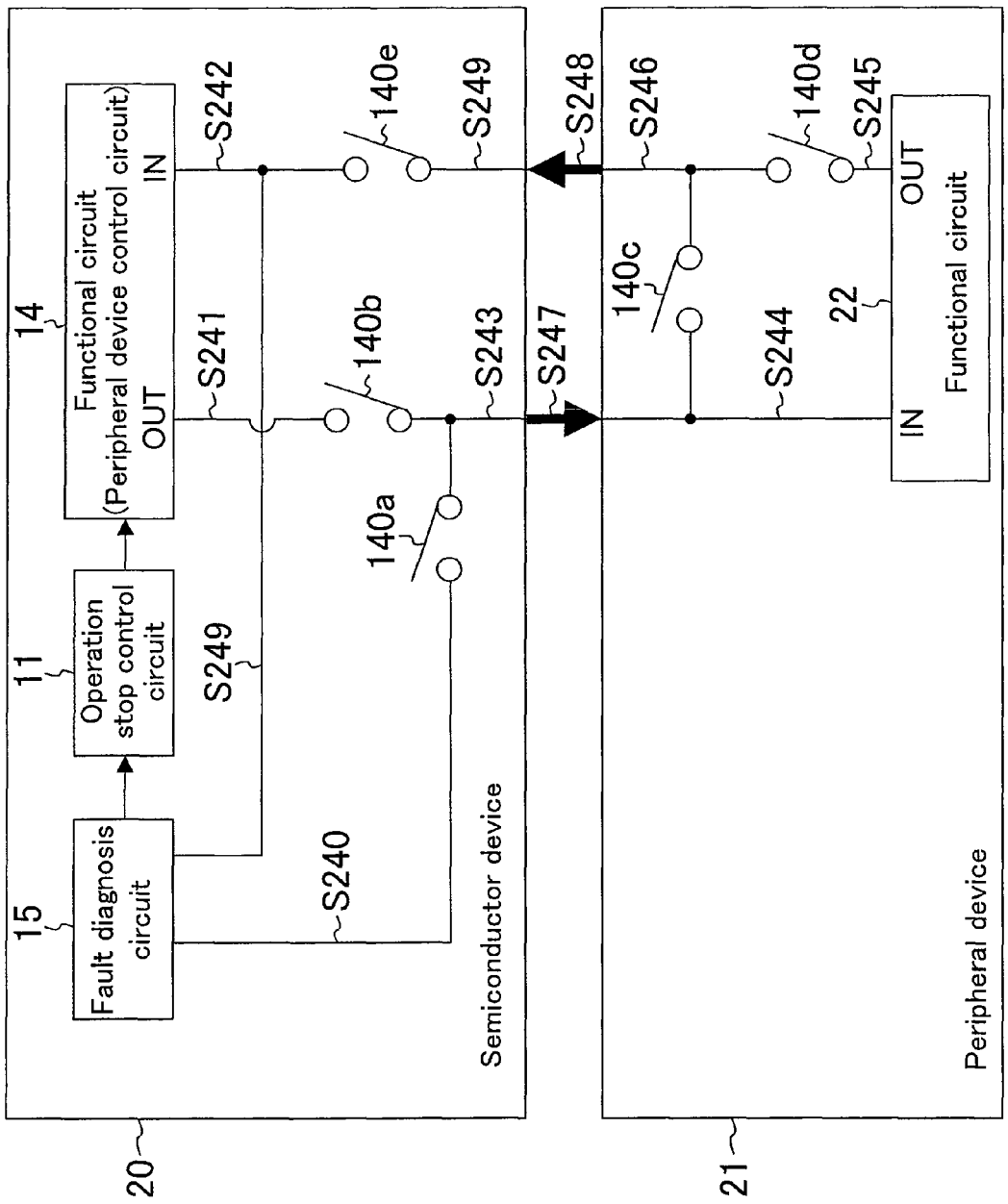
FIG. 8 illustrates the structure of a system according to a second embodiment of the invention.
Figure 9:
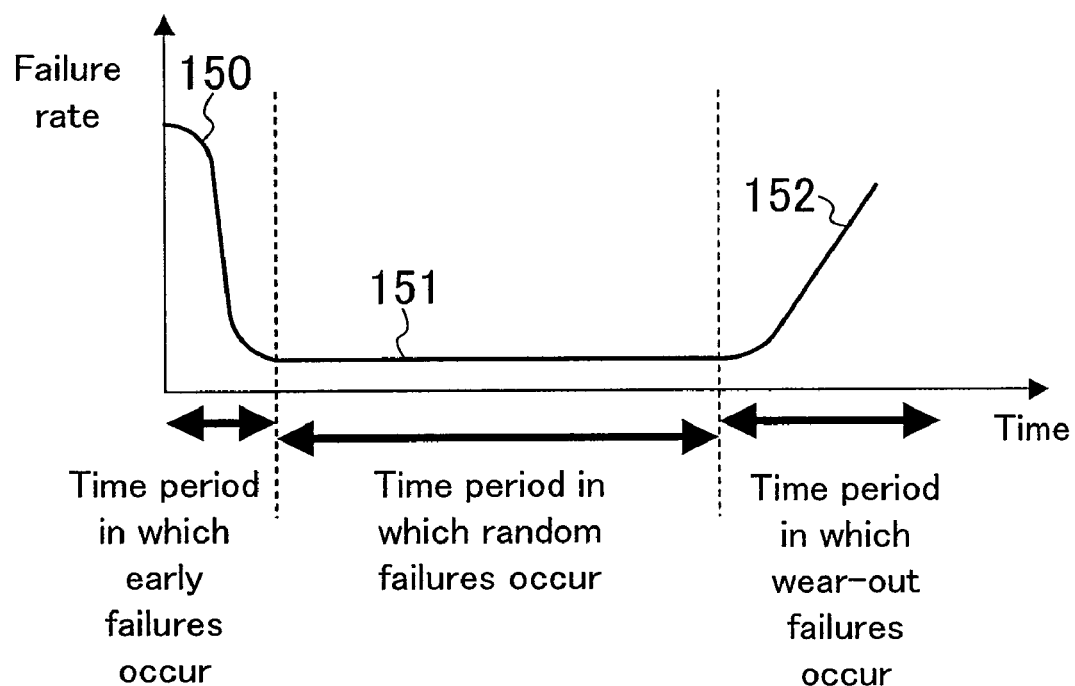
FIG. 9 indicates the rate of failures in a semiconductor circuit.

FIG. 8 illustrates an example of the structure of a system according to a second embodiment of the invention. This system includes a semiconductor device 20 and a peripheral device 21. The semiconductor device 20 and the peripheral device 21 communicate with each other. Furthermore in this system, fault diagnosis on the semiconductor device 20 and the peripheral device 21 is carried out as follows.

As shown in FIG. 8, input/output signals which connect a functional circuit 14 in the semiconductor device 20 and a functional circuit 22 in the peripheral device 21 also have a connection to a fault diagnosis circuit 15 in the semiconductor device 20.

During normal operation, the functional circuits 14 and 22 are connected by putting switching devices 140b, 140d, and 140e into the connection state and putting switching devices 140a and 140c into the disconnection state.

When a fault diagnosis is conducted on the connection path between the semiconductor device 20 and the peripheral device 21, the switching devices 140a, 140c, and 140e are put into the connection state, and the switching devices 140b and 140d are put into the disconnection state. The fault diagnosis circuit 15 outputs a test signal S240, and it is determined whether that output signal is passed through the peripheral device 21 and input as an input signal S249 to the fault diagnosis circuit 15. If the signals S240 and S249 are different signals, it can be determined that the connection path between the semiconductor device 20 and the peripheral device 21 is faulty.

When a fault diagnosis is conducted on the peripheral device 21, the switching devices 140a, 140d, and 140e are put into the connection state, and the switching devices 140b and 140c are put into the disconnection state. The fault diagnosis circuit 15 outputs the test signal S240 to operate the functional circuit 22, and the output signal S245 of the functional circuit 22 is input as the input signal S249 to the fault diagnosis circuit 15. If the input signal S249 is different from an expected value which is output when the functional circuit 22 operates properly, it can be determined that there is a fault in the functional circuit 22.

If the above-described fault diagnoses detect that either the functional circuit 14 or 22 is faulty, the switching devices 140d and 140e are put into the disconnection state to cut off the signals between the functional circuits 14 and 22, whereby other non-faulty devices are prevented from becoming faulty.

In a case where the functional circuit 22 is an external memory and determined to be faulty as a result of the above-described fault diagnosis, redundancy repair in the external memory may be conducted from the semiconductor device 20 so that the life of the system is extended.

INDUSTRIAL APPLICABILITY

The semiconductor devices according to the invention are capable of performing fault detection with small circuits and stopping the operation of the semiconductor devices in accordance with fault prediction before a fault occurs, thereby increasing the security of the semiconductor devices.

The invention claimed is:

1. A semiconductor device comprising:
a stop condition determination unit configured to make at least one operation-stop determination; and
an operation stop control unit configured to stop operation of part of the semiconductor device according to the determination made by the stop condition determination means,
wherein the stop condition determination means includes:
a shift register including two or more flip flops, and
a fault diagnosis unit configured to determine the presence or absence of a fault according to an output from the shift register,
wherein the shift register includes:
a first flip flop;
a delay unit configured to receive an output from the first flip flop;
a second flip flop for receiving an output from the delay unit; and
a unit for adjusting a delay time of the delay unit.

2. A semiconductor device comprising:
a stop condition determination unit configured to make at least one operation-stop determination; and
an operation stop control unit configured to stop operation of part of the semiconductor device according to the determination made by the stop condition determination unit,
wherein the stop condition determination unit includes:
a power supply voltage measuring unit configured to measure a power supply voltage;
a storage unit configured to regularly store the value of the measured power supply voltage; and
a fault diagnosis unit configured to determine the presence or absence of a fault according to a comparison between the voltage value measured by the power supply voltage measuring unit and the voltage value stored in the storage unit.

3. A semiconductor device comprising:
a stop condition determination unit configured to make at least one operation-stop determination; and
an operation stop control unit configured to stop operation of part of the semiconductor device according to the determination made by the stop condition determination unit,
wherein the stop condition determination unit includes:
a timer in which a specified period of time is set; and
a unit configured to generate a stop condition when the amount of time measured by the timer has reached the specified period of time.

4. The semiconductor device of claim 1, wherein the stop condition determination unit generates a stop condition according to a stop request from outside the semiconductor device.

5. A semiconductor device comprising:
a stop condition determination unit configured to make at least one operation-stop determination; and
an operation stop control unit configured to stop operation of part of the semiconductor device according to the determination made by the stop condition determination unit,
wherein the operation stop control unit includes a fuse and stops operation of part of the semiconductor device by disconnecting the fuse.

6. The semiconductor device of claim 5, wherein the operation stop control unit further includes an anti-fuse in parallel with the fuse, said operation stop control unit terminates the operation stop state of part of the semiconductor device even after the disconnection of the fuse by reconnecting the disconnected fuse by the anti-fuse.

7. The semiconductor device of claim 1, further comprising storage unit configured to store a result of the determination made by the stop condition determination unit.

8. The semiconductor device of claim 1, further comprising unit configured to convey a result of the determination made by the stop condition determination unit to outside the semiconductor device.

9. A semiconductor-device-equipped system comprising:
a semiconductor device including:
a stop condition determination unit configured to make at least one operation-stop determination, and
an operation stop control unit configured to stop operation of part of the semiconductor device according to the determination made by the stop condition determination unit; and
a peripheral device,
wherein the stop condition determination unit conducts fault diagnosis on a connection path between the semiconductor device and the peripheral device.

10. A semiconductor-device-equipped system comprising:
a semiconductor device including:
a stop condition determination unit configured to make at least one operation-stop determination, and
an operation stop control unit configured to stop operation of part of the semiconductor device according to the determination made by the stop condition determination unit; and
a peripheral device,
wherein the stop condition determination unit conducts fault diagnosis on the peripheral device.

* * * * *